(12) United States Patent
Pavloff

(10) Patent No.: US 7,901,552 B2
(45) Date of Patent: Mar. 8, 2011

(54) SPUTTERING TARGET WITH GROOVES AND INTERSECTING CHANNELS

(75) Inventor: Cristopher M. Pavloff, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 808 days.

(21) Appl. No.: 11/867,914

(22) Filed: Oct. 5, 2007

(65) Prior Publication Data

US 2009/0090620 A1 Apr. 9, 2009

(51) Int. Cl.
*C23C 14/35* (2006.01)

(52) U.S. Cl. .......... 204/298.09; 204/298.12; 204/298.19; 204/298.2

(58) Field of Classification Search ............. 204/298.09, 204/298.12, 298.19, 298.2
See application file for complete search history.

(56) References Cited

U.S. PATENT DOCUMENTS

| | | | |
|---|---|---|---|
| 3,716,462 A | 2/1973 | Jensen | |
| 3,725,220 A | 4/1973 | Kessler et al. | |
| 4,374,722 A | 2/1983 | Zega | |
| 4,415,421 A | 11/1983 | Sasanuma | |
| 4,430,173 A | 2/1984 | Boudot | |
| 4,505,947 A | 3/1985 | Vukanovic et al. | |
| 4,545,882 A | 10/1985 | Kelvey | |
| 4,606,802 A | 8/1986 | Kobayashi et al. | |
| 4,905,886 A | 3/1990 | Kennedy et al. | |
| 4,924,436 A | 5/1990 | Strand | |
| 4,983,269 A | 1/1991 | Wegmann | |
| 4,995,958 A | 2/1991 | Anderson et al. | |
| 5,041,194 A | 8/1991 | Mori et al. | |
| 5,166,758 A | 11/1992 | Ovshinsky et al. | |
| 5,215,639 A | 6/1993 | Boys | |
| 5,262,030 A * | 11/1993 | Potter ...................... 204/298.2 |
| 5,314,597 A | 5/1994 | Harra | |
| 5,342,496 A | 8/1994 | Stellrecht | |
| 5,407,551 A | 4/1995 | Sieck et al. | |
| 5,409,590 A | 4/1995 | Hurwitt et al. | |
| 5,433,835 A | 7/1995 | Demaray et al. | |
| 5,435,965 A | 7/1995 | Mashima et al. | |
| 5,458,759 A | 10/1995 | Hosokawa et al. | |
| 5,487,822 A | 1/1996 | Demaray et al. | |
| 5,487,823 A | 1/1996 | Sawada et al. | |
| 5,490,913 A | 2/1996 | Schertler et al. | |
| 5,538,603 A | 7/1996 | Guo | |
| 5,565,071 A | 10/1996 | Demaray et al. | |

(Continued)

FOREIGN PATENT DOCUMENTS

EP 1350861 10/2003

(Continued)

OTHER PUBLICATIONS

Allen, et al. "Sputtering Target Having Increased Life and Sputtering Uniformity", U.S. Appl. No. 11/764,772, filed Jun. 18, 2007.

*Primary Examiner* — Rodney G McDonald
(74) *Attorney, Agent, or Firm* — Ashok K. Janah

(57) ABSTRACT

A sputtering chamber has a sputtering target comprising a backing plate and a sputtering plate. The backing plate comprises a backside surface having a plurality of concentric circular grooves and a plurality of arcuate channels which intersect the circular grooves. The sputtering target can be positioned abutting a heat exchanger housing which holds heat transfer fluid and a plurality of rotatable magnets.

24 Claims, 4 Drawing Sheets

U.S. PATENT DOCUMENTS

| | | |
|---|---|---|
| 5,595,337 A | 1/1997 | Demaray et al. |
| 5,595,938 A | 1/1997 | Miyazaki |
| 5,628,889 A * | 5/1997 | Gardell et al. ............ 204/298.09 |
| 5,643,422 A | 7/1997 | Yamada |
| 5,685,959 A | 11/1997 | Bourez et al. |
| 5,693,203 A | 12/1997 | Ohhashi et al. |
| 5,695,825 A | 12/1997 | Scruggs |
| 5,714,768 A | 2/1998 | Ovshinsky et al. |
| 5,772,858 A | 6/1998 | Tepman |
| 5,789,717 A | 8/1998 | Imaizumi et al. |
| 5,798,029 A | 8/1998 | Morita |
| 5,799,860 A | 9/1998 | Demaray et al. |
| 5,803,342 A | 9/1998 | Kardokus |
| 5,830,327 A | 11/1998 | Kolnekow |
| 5,876,573 A | 3/1999 | Moslehi et al. |
| 5,879,524 A | 3/1999 | Hurwitt et al. |
| 5,887,481 A | 3/1999 | Leroy et al. |
| 5,914,018 A | 6/1999 | Fu et al. |
| 5,919,345 A | 7/1999 | Tepman |
| 5,942,089 A | 8/1999 | Sproul et al. |
| 5,963,778 A | 10/1999 | Stellrecht |
| 6,001,426 A | 12/1999 | Witherspoon et al. |
| 6,010,583 A | 1/2000 | Annavarapu et al. |
| 6,024,852 A | 2/2000 | Tamura et al. |
| 6,040,545 A | 3/2000 | Taki et al. |
| 6,042,706 A | 3/2000 | Fu |
| 6,059,945 A | 5/2000 | Fu et al. |
| 6,071,323 A | 6/2000 | Kawaguchi |
| 6,071,389 A | 6/2000 | Zhang |
| 6,073,830 A | 6/2000 | Hunt et al. |
| 6,086,735 A | 7/2000 | Gilman et al. |
| 6,139,701 A | 10/2000 | Pavate et al. |
| 6,146,509 A | 11/2000 | Aragon |
| 6,149,776 A | 11/2000 | Tang et al. |
| 6,179,973 B1 | 1/2001 | Lai et al. |
| 6,183,614 B1 | 2/2001 | Fu |
| 6,183,686 B1 | 2/2001 | Bardus et al. |
| 6,187,682 B1 | 2/2001 | Denning et al. |
| 6,190,516 B1 | 2/2001 | Xiong et al. |
| 6,199,259 B1 | 3/2001 | Demaray et al. |
| 6,221,217 B1 | 4/2001 | Moslehi et al. |
| 6,227,435 B1 | 5/2001 | Lazarz et al. |
| 6,231,725 B1 | 5/2001 | Nulman et al. |
| 6,238,528 B1 | 5/2001 | Xu et al. |
| 6,244,121 B1 | 6/2001 | Hunter |
| 6,251,242 B1 | 6/2001 | Fu et al. |
| 6,267,851 B1 | 7/2001 | Hosokawa |
| 6,274,008 B1 | 8/2001 | Gopalraja et al. |
| 6,277,249 B1 | 8/2001 | Gopalraja et al. |
| 6,277,263 B1 | 8/2001 | Chen |
| 6,283,357 B1 | 9/2001 | Kulkarni et al. |
| 6,287,437 B1 | 9/2001 | Pandhumsoporn et al. |
| 6,299,740 B1 | 10/2001 | Hieronymi et al. |
| 6,309,556 B1 | 10/2001 | Joyce et al. |
| 6,337,151 B1 | 1/2002 | Uzoh et al. |
| 6,337,453 B1 | 1/2002 | Miller et al. |
| 6,338,781 B1 | 1/2002 | Sichmann et al. |
| 6,340,415 B1 | 1/2002 | Raaijmakers et al. |
| 6,344,114 B1 | 2/2002 | Sichmann et al. |
| 6,346,177 B2 | 2/2002 | Leiphart |
| 6,365,010 B1 | 4/2002 | Hollars |
| 6,406,599 B1 | 6/2002 | Subramani et al. |
| 6,409,965 B1 | 6/2002 | Nagata et al. |
| 6,413,382 B1 | 7/2002 | Wang et al. |
| 6,413,387 B1 | 7/2002 | Shi et al. |
| 6,413,858 B1 | 7/2002 | Chopra |
| 6,416,634 B1 | 7/2002 | Mostovoy et al. |
| 6,419,806 B1 | 7/2002 | Holcomb et al. |
| 6,436,251 B2 | 8/2002 | Gopalraja et al. |
| 6,437,383 B1 | 8/2002 | Xu |
| 6,440,221 B2 | 8/2002 | Shamouilian et al. |
| 6,444,104 B2 | 9/2002 | Gopalraja et al. |
| 6,451,177 B1 | 9/2002 | Gopalraja et al. |
| 6,454,919 B1 | 9/2002 | Sundarrahan et al. |
| 6,464,889 B1 | 10/2002 | Lee et al. |
| 6,475,854 B2 | 11/2002 | Narwankar et al. |
| 6,482,302 B1 | 11/2002 | Li et al. |
| 6,487,910 B1 | 12/2002 | Leybovich |
| 6,491,801 B1 | 12/2002 | Gung |
| 6,494,098 B1 | 12/2002 | Leybovich |
| 6,495,009 B1 | 12/2002 | Gung |
| 6,500,321 B1 | 12/2002 | Ashtiani et al. |
| 6,507,061 B1 | 1/2003 | Hudgens et al. |
| 6,518,086 B2 | 2/2003 | Beck et al. |
| 6,537,428 B1 | 3/2003 | Xiong et al. |
| 6,579,431 B1 | 6/2003 | Bolcavage et al. |
| 6,599,405 B2 | 7/2003 | Hunt et al. |
| 6,610,959 B2 | 8/2003 | Carlson et al. |
| 6,619,537 B1 | 9/2003 | Zhang et al. |
| 6,620,296 B2 | 9/2003 | Gogh et al. |
| 6,623,610 B1 | 9/2003 | Onishi |
| 6,627,050 B2 | 9/2003 | Miller et al. |
| 6,635,219 B2 | 10/2003 | Wen et al. |
| 6,652,668 B1 | 11/2003 | Perry et al. |
| 6,677,254 B2 | 1/2004 | Narwankar et al. |
| 6,699,375 B1 | 3/2004 | Crocker |
| 6,708,870 B2 | 3/2004 | Koenigsmann et al. |
| 6,709,557 B1 | 3/2004 | Kailasam et al. |
| 6,716,321 B2 | 4/2004 | Gilmore et al. |
| 6,730,196 B2 | 5/2004 | Wang et al. |
| 6,739,196 B2 | 5/2004 | Leybovich |
| 6,743,342 B2 | 6/2004 | Wang |
| 6,749,103 B1 | 6/2004 | Ivanov et al. |
| 6,750,156 B2 | 6/2004 | Le et al. |
| 6,759,267 B2 | 7/2004 | Chen |
| 6,776,879 B2 | 8/2004 | Yamamoto et al. |
| 6,797,362 B2 | 9/2004 | Parfeniuk et al. |
| 6,824,652 B2 | 11/2004 | Park |
| 6,840,427 B2 | 1/2005 | Ivanov |
| 6,841,050 B2 | 1/2005 | Hong et al. |
| 6,848,608 B2 | 2/2005 | Wickersham |
| 6,852,202 B2 | 2/2005 | Miller et al. |
| 6,858,116 B2 | 2/2005 | Okabe et al. |
| 6,858,277 B1 | 2/2005 | Yamada et al. |
| 6,872,284 B2 | 3/2005 | Ivanov et al. |
| 6,887,356 B2 | 5/2005 | Ford et al. |
| 6,916,407 B2 | 7/2005 | Vosser et al. |
| 6,946,408 B2 | 9/2005 | Le et al. |
| 6,955,852 B2 | 10/2005 | Ivanov |
| 6,992,261 B2 | 1/2006 | Kachalov et al. |
| 7,037,762 B2 | 5/2006 | Joo et al. |
| 7,063,773 B2 | 6/2006 | Ivanov et al. |
| 7,115,193 B2 | 10/2006 | Takahashi |
| 7,115,927 B2 | 10/2006 | Hideki et al. |
| 7,131,883 B2 | 11/2006 | Park et al. |
| 7,146,703 B2 | 12/2006 | Ivanov |
| 7,175,802 B2 | 2/2007 | Sandlin et al. |
| 7,297,247 B2 | 11/2007 | Subramani et al. |
| 7,316,763 B2 | 1/2008 | Hosokawa et al. |
| 7,331,250 B2 | 2/2008 | Hunter |
| 7,476,289 B2 | 1/2009 | White |
| 7,504,008 B2 | 3/2009 | Doan et al. |
| 7,550,055 B2 | 6/2009 | Le et al. |
| 7,550,066 B2 | 6/2009 | Tepman |
| 7,588,668 B2 | 9/2009 | Ye et al. |
| 7,644,745 B2 | 1/2010 | Le et al. |
| 2001/0030172 A1 | 10/2001 | Takahashi et al. |
| 2001/0035237 A1 | 11/2001 | Nagano et al. |
| 2001/0035238 A1 | 11/2001 | Nagano et al. |
| 2001/0045353 A1 | 11/2001 | Hieronymi et al. |
| 2002/0014289 A1 | 2/2002 | Nagano et al. |
| 2002/0033330 A1 | 3/2002 | Demaray et al. |
| 2002/0075631 A1 | 6/2002 | Singh et al. |
| 2002/0081804 A1 | 6/2002 | Gill et al. |
| 2002/0083571 A1 | 7/2002 | Lee et al. |
| 2002/0100680 A1 | 8/2002 | Yamamoto et al. |
| 2002/0112955 A1 | 8/2002 | Aimone et al. |
| 2003/0035906 A1 | 2/2003 | Memarian et al. |
| 2003/0102207 A1 | 6/2003 | Wu et al. |
| 2003/0124748 A1 | 7/2003 | Summerfelt et al. |
| 2003/0127319 A1 | 7/2003 | Demaray et al. |
| 2003/0175142 A1 | 9/2003 | Milonopoulou et al. |
| 2003/0218054 A1 | 11/2003 | Koenigsmann et al. |
| 2004/0016635 A1 | 1/2004 | Ford et al. |
| 2004/0020769 A1 | 2/2004 | Ivanov et al. |
| 2004/0035698 A1 | 2/2004 | Ivanov et al. |
| 2004/0056070 A1 | 3/2004 | Ivanov |

| | | |
|---|---|---|
| 2004/0079634 A1 | 4/2004 | Wickersham et al. |
| 2004/0089542 A1 | 5/2004 | Liu et al. |
| 2004/0113364 A1 | 6/2004 | Ivanov |
| 2004/0115945 A1 | 6/2004 | Lowrey et al. |
| 2004/0144638 A1 | 7/2004 | Jaso |
| 2004/0165422 A1 | 8/2004 | Hideki et al. |
| 2004/0222088 A1 | 11/2004 | Subramani et al. |
| 2004/0256226 A1 | 12/2004 | Wickersham |
| 2005/0002227 A1 | 1/2005 | Hideki et al. |
| 2005/0011749 A1 | 1/2005 | Kachalov et al. |
| 2005/0029094 A1 | 2/2005 | Watanabe et al. |
| 2005/0029502 A1 | 2/2005 | Hudgens |
| 2005/0061857 A1 | 3/2005 | Hunt et al. |
| 2005/0067469 A1 | 3/2005 | Facey et al. |
| 2005/0072668 A1 | 4/2005 | Kennedy et al. |
| 2005/0089699 A1 | 4/2005 | Lin et al. |
| 2005/0092604 A1 | 5/2005 | Ivanov |
| 2005/0147150 A1 | 7/2005 | Wickersham et al. |
| 2005/0161322 A1 | 7/2005 | Smathers |
| 2005/0178653 A1 | 8/2005 | Fisher |
| 2006/0021870 A1 | 2/2006 | Tsai et al. |
| 2006/0070876 A1 | 4/2006 | Wu et al. |
| 2006/0081459 A1 | 4/2006 | Tsai et al. |
| 2006/0099126 A1 | 5/2006 | Hosono et al. |
| 2006/0105182 A1 | 5/2006 | Brueckner et al. |
| 2006/0108217 A1 | 5/2006 | Krempel-Hesse et al. |
| 2006/0188742 A1 | 8/2006 | West et al. |
| 2006/0266639 A1 | 11/2006 | Le et al. |
| 2006/0283703 A1 | 12/2006 | Lee et al. |
| 2006/0289305 A1 | 12/2006 | White |
| 2007/0056845 A1 | 3/2007 | Ye et al. |
| 2007/0102286 A1 | 5/2007 | Scheible et al. |
| 2007/0125646 A1 | 6/2007 | Young et al. |
| 2007/0170052 A1 | 7/2007 | Ritchie et al. |
| 2007/0173059 A1 | 7/2007 | Young et al. |
| 2007/0215463 A1 | 9/2007 | Parkhe |
| 2007/0246346 A1 | 10/2007 | Subramani et al. |
| 2008/0308416 A1 | 12/2008 | Allen et al. |
| 2009/0090620 A1 | 4/2009 | Pavloff |
| 2009/0107834 A1 | 4/2009 | Ye et al. |
| 2009/0114528 A1 | 5/2009 | Lindenberg et al. |
| 2009/0178919 A1 | 7/2009 | Lopp et al. |
| 2009/0272641 A1 | 11/2009 | Mueller et al. |

FOREIGN PATENT DOCUMENTS

| | | |
|---|---|---|
| GB | 2049737 | 12/1980 |
| GB | 2155495 | 9/1985 |
| JP | 58-147558 | 9/1983 |
| JP | 63290270 | 11/1988 |
| JP | 1283367 | 11/1989 |
| JP | 07224377 | 8/1995 |
| JP | 09111452 | 4/1997 |
| JP | 11-106904 | 4/1999 |
| JP | 2000265265 | 9/2000 |
| JP | 2002-060935 | 2/2002 |
| JP | 2004-132725 | 4/2004 |
| WO | WO-01/39250 | 5/2001 |
| WO | WO-03062491 | 7/2003 |

* cited by examiner

SPUTTERING TARGET WITH GROOVES AND INTERSECTING CHANNELS

BACKGROUND

Embodiments of the present invention relate to a sputtering target for a sputtering chamber used to process a substrate.

A sputtering chamber is used to sputter deposit material onto a substrate in the fabrication of integrated circuits and displays. Typically, the sputtering chamber comprises an enclosure around a sputtering target facing a substrate support, a process zone into which a process gas is introduced, a gas energizer to energize the process gas, and an exhaust port to exhaust and control the pressure of the process gas in the chamber. The sputtering target is bombarded by energetic ions formed in the energized gas causing material to be knocked off the target and deposited as a film on the substrate. The sputtered material can be a metal, such as for example aluminum, copper, tungsten, titanium, cobalt, nickel or tantalum; or a metal compound, such as for example, tantalum nitride, tungsten nitride or titanium nitride.

In certain sputtering processes, a magnetic field generator provides a shaped magnetic field about the sputtering surface of the target to improve sputtering properties and the sputtering surface of the target. For example, in magnetron sputtering, a set of rotatable magnets rotate behind the sputtering targets to produce a magnetic field about the front surface of the target. The rotating magnetic field provides improved sputtering by controlling the rate of sputtering across the sputtering target.

A cooling system passes heat transfer fluid through a housing surrounding the rotatable magnets to cool the magnets and, more importantly, the underlying sputtering target. However, conventional cooling systems often fail to remove sufficiently high levels of heat from the sputtering target and/or fail to provide spatially uniform heat removal from the target. As a result, hotter regions of the sputtering target are often sputtered at higher sputtering rates than adjacent regions, resulting in uneven sputtering across the target surface. Uneven target sputtering in combination with a rotating magnetic field can cause a sputtering target 10 to develop a sputtering surface 12 having erosion grooves 14 and microcracks 16 that extend downward from the erosion grooves can also form, as shown in FIGS. 1A and 1B. The localized microcracks 16 which occur at the erosion grooves 14 can result in the ejection of sputtered particles during the sputtering process, which then deposit on the substrate to reduce yields. Sputtered particles that land on chamber components can also flake off at a later time due to thermal stresses arising from heating and cooling cycles.

Thus it is desirable to have a sputtering target capable of being more efficiently, and more uniformly, cooled by a target cooling system. It is also desirable for the target to exhibit reduced localized cracking from thermal stresses.

DRAWINGS

The following description, claims, and accompanying drawings, illustrate exemplary embodiments of different features which can be used by themselves, or in combination with other features, and should not be limited to the exemplary versions shown in the drawings:

SUMMARY

A sputtering target for use in a sputtering chamber, the sputtering target consisting of a backing plate with a backside surface having radially inner, middle and outer regions and a sputtering plate mounted on the front surface of the backing plate. The backside surface of the backing plate has a plurality of circular grooves which are spaced apart from one another; and at least one arcuate channel cutting through the circular grooves and extending from the radially inner region to the radially outer region of the backing plate.

A magnetron sputtering target assembly for use in a sputtering chamber, the assembly comprising a heat exchanger housing and a sputtering target abutting the housing. The sputtering target comprises a backing plate with a sputtering plate mounted to the frontside surface of the backing plate. The backing plate has backside surface with radially inner, middle and outer regions, a plurality of circular grooves which are spaced apart from, and concentric to, one another, and at least one arcuate channel that extends from the radially inner region to the radially outer region of the backing plate, and cuts through the circular grooves. The heat exchanger housing is capable of holding a heat transfer fluid about a plurality of rotating magnets and the heat transfer fluid contacts a backside surface of the sputtering target.

Another magnetron sputtering target assembly also comprises a heat exchanger housing and a sputtering target abutting the housing. The sputtering target comprises a backing plate and a sputtering plate mounted to the front surface of the backing plate. The backing plate having a backside surface that includes radially inner, middle and outer regions, a plurality of concentric circular grooves located at radially middle region of the backside surface, and a plurality of arcuate grooves extending from the radially inner region to the radially outer region. The housing is capable of holding heat transfer fluid about a plurality of rotatable magnets and the heat transfer fluid contacts a backside surface of the sputtering target.

DESCRIPTION

Figure 1A:
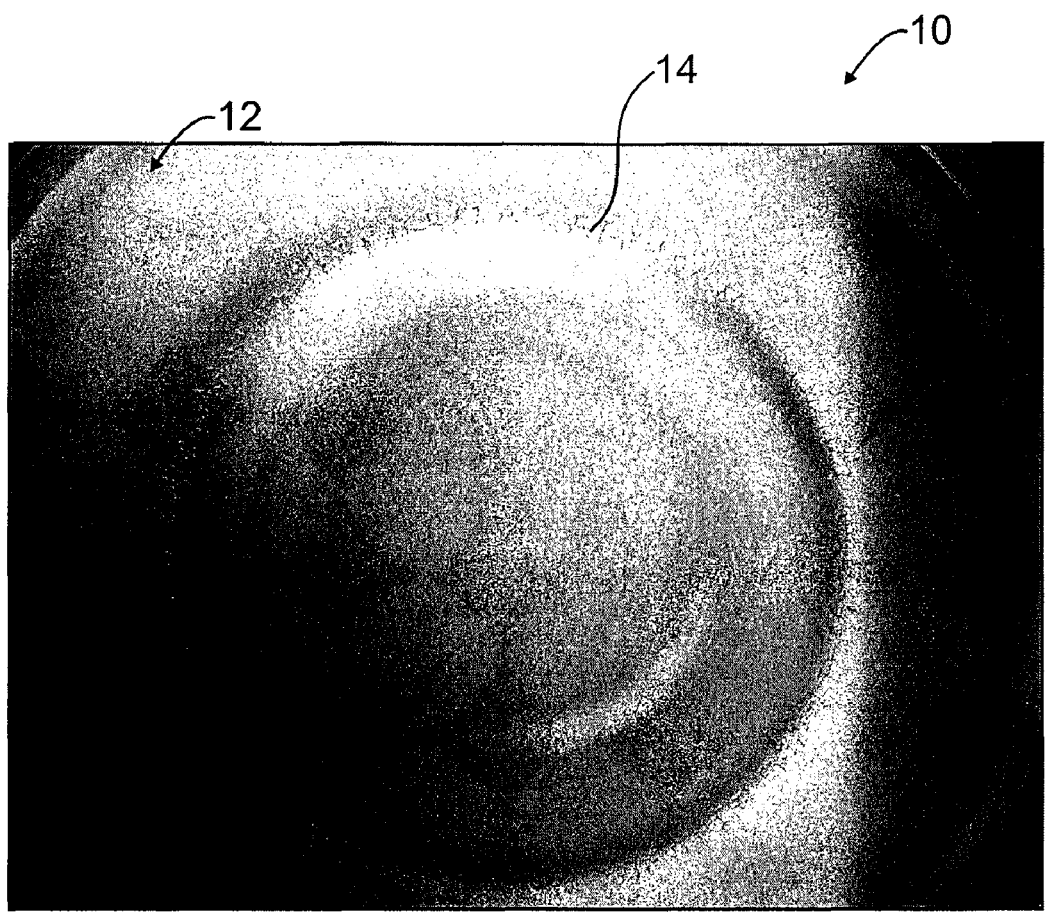
FIGS. 1A and 1B (PRIOR ART) are photos of a sputtering target showing erosion grooves and microcracks.
Figure 1B:
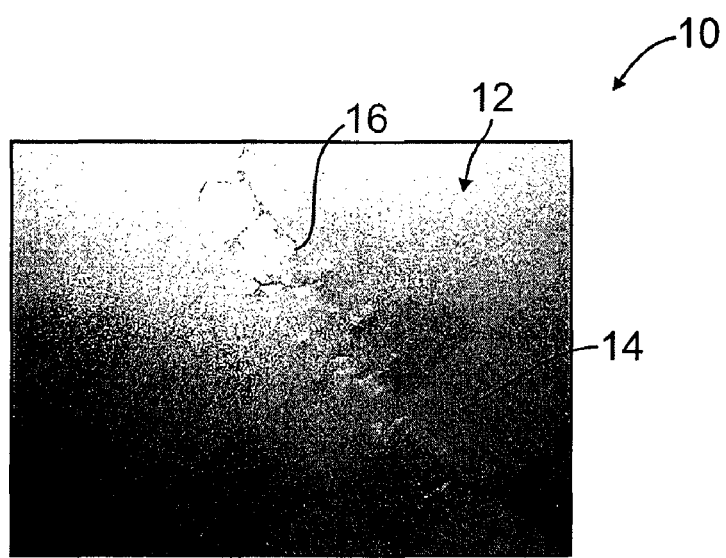
Figure 2:
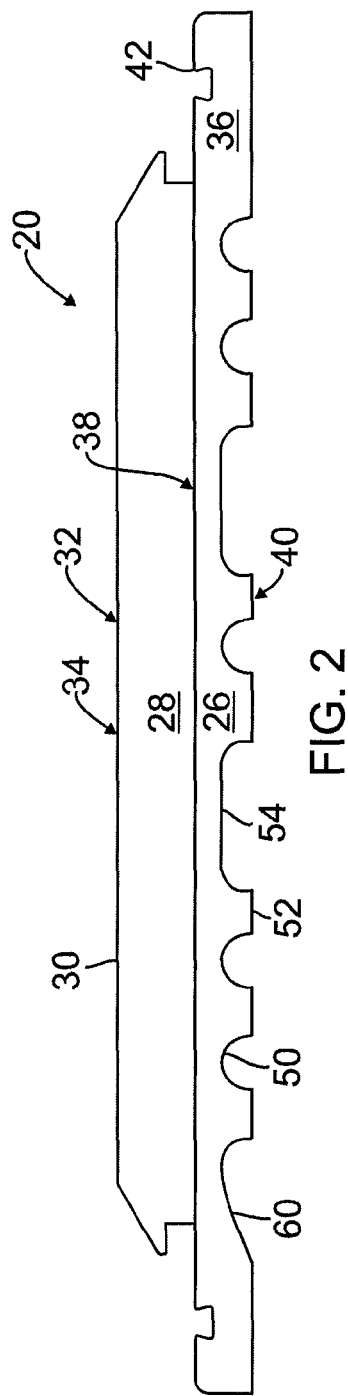
FIG. 2 is a sectional side view of an embodiment of a sputtering target comprising a sputtering plate mounted on a backing plate.

An exemplary embodiment of a sputtering target 20 that can be used in a sputtering process chamber 22 to deposit sputtered material on a substrate 24 with reduced erosion groove and microcracking, is shown in FIGS. 2 to 6. Referring to FIG. 2, in one embodiment, the sputtering target 20 comprises a backing plate 26 and a sputtering plate 28. The sputtering plate 28 and backing plate 26 can be a monolith comprising a single structure made from the same high-purity material and that serves as both a backing plate and a sputtering plate or they may be separate structures that are bonded together to form a sputtering target. The sputtering plate 28 comprises a central cylindrical mesa 30 that serves as a sputtering surface 34, and which has a top plane 32 that is maintained parallel to the plane of a substrate 24 during use of the target 20 in a chamber 22. The sputtering plate 28 is made from a metal or metal compound. For example, the sputtering plate 28 can be composed of, for example aluminum, copper, cobalt, nickel, tantalum, titanium, tungsten and alloys thereof. The sputtering plate 28 can also be a metal compound, such as for example, tantalum nitride, tungsten nitride or titanium nitride. In one version, the sputtering plate 28 comprises titanium at a high purity level, for example, at least about 99.9%, or even at least about 99.99%.

Figure 6:
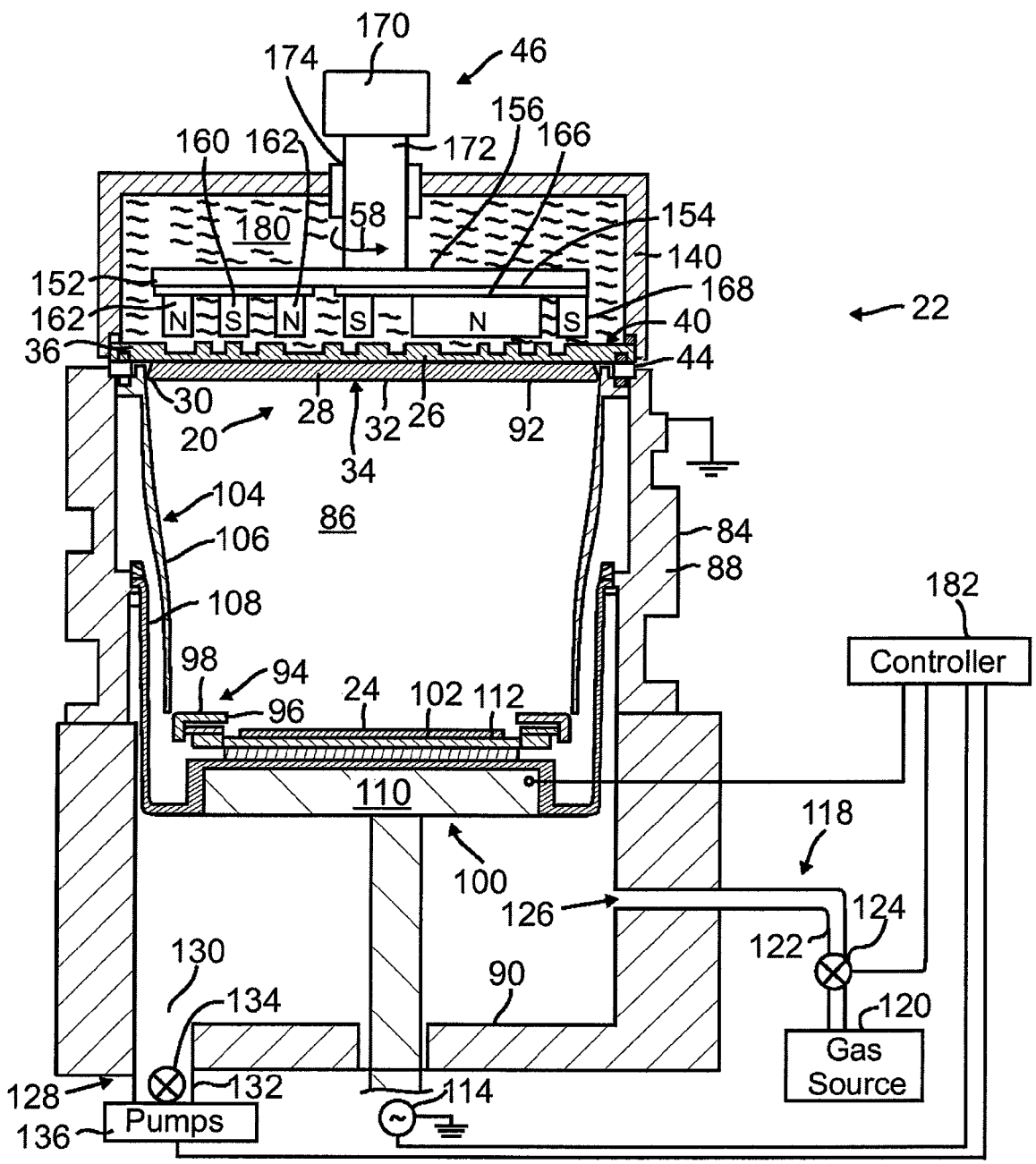
FIG. 6 is a schematic sectional side view of a sputtering chamber showing a heat exchanger enclosing a rotating magnetic assembly and the backside surface of a sputtering target.

In one version, the sputtering plate 28 is mounted on a backing plate 26 which is a separate structure and which has a front surface 38 to support the sputtering plate 28 and an annular flange 36 that extends beyond the radius of the sputtering plate 28. The annular flange 36 comprises a peripheral circular surface and has outer footing 42 that rests on an isolator 44 in the chamber 22, as shown in FIG. 6. The isolator 44 electrically isolates and separates the backing plate 26 from the chamber 22, and is typically a ring made from a ceramic material, such as aluminum oxide.

The backing plate 26 is made from a material selected to have a high thermal conductivity and to circulate a heat transfer fluid therein. A suitably high thermal conductivity of the backing plate 26 is at least about 200 W/mK, for example, from about 220 to about 400 W/mK. Such thermal conductivity levels allow the target 20 to be operated for longer process time periods by efficiently dissipating the heat generated in the target 20. In one version, the backing plate 26 is made from a metal, such as copper or aluminum. In another version, the backing plate 26 comprises a metal alloy, such as for example copper-zinc (naval brass), or chromium-copper alloy. In one exemplary embodiment the backing plate 26 comprises C18000 which is an alloy having component weights of Cr (0.8%), Cu (96.1%), Ni (2.5%) and Si (0.6%). The backing plate 26 can also be a separate structure containing one or more bonded plates.

The backing plate 26 can also have an electrical resistivity that is in a desirable range to reduce erosion grooving while still allowing operation of the target 20 for an extended time period. The electrical resistivity should be sufficiently low to allow the target 20 to be electrically biased or charged during sputtering. However, the electrical resistivity should also be sufficiently high to reduce the effect of eddy currents in the target 20, as the heat generated by the eddy current as it travels along a pathway through the target 20 is proportional to the electrical resistance encountered along the pathway. In one version, the electrical resistivity of the backing plate 26 is from about 2 to about 5 μohm cm or even from about 2.2 to about 4.1 μohm cm.

An exemplary backing plate 26 is made from a metal alloy comprising copper-chrome. The resistivity of copper-chrome does not change until its temperatures exceed 600° C. which is sufficiently high to exceed normal sputtering process temperatures. In one version, the copper-chrome alloy comprises a ratio of copper to chrome of from about 80:1 to about 165:1. The copper-chrome alloy comprises copper in a wt % of from about 98.5 to about 99.1 wt %, and chrome in a wt % of from about 0.6 to about 1.2 wt %. The copper-chrome alloy has a thermal conductivity of about 340 W/mK and an electrical resistivity of about 2.2 μohm cm.

In one version, the backing plate 26 comprises a backside surface 40 that opposes the front surface 38, and which has a pattern of circular grooves 50 (or 50a and 50b) and intersecting arcuate channels 54 (or 54a and 54b). The intersecting arcuate channels 54 cut through the circular grooves 50 at angles ranging from 60 to 90° relative to the localized horizontal tangent to the groove 50 at the point of intersection. The intersecting grooves break up the continuous trench structure of the circular grooves 54 to allow heat transfer fluid to circulate between grooves 50 at the intersection points. The intersecting arcuate channels 54 have been found to significantly reduce stagnation of fluid within the continuous trench structures of the circular grooves 50. Unexpectedly and surprisingly, the combination of the circular grooves 50 and intersecting arcuate channels 54 on the backside surface of the backing plate 26, were also found to substantially reduce the number of particles that deposit on a particular substrate during a sputtering process.

It is believed that the reduction in particulate contamination from the target results from the effect of the intersecting grooves and arcuate channels 50, 54 on the fluid dynamics of the heat transfer fluid in the concentric grooves 50 of the backside surface 40 of the target 20. Generally, the heat transfer fluid at the bottom and nearest the walls of the concentric grooves 50 moves more slowly than the bulk of the fluid because of friction between the fluid and the surface. This frictional effect can create a stagnant layer of hot fluid at the bottom of the grooves 50 on the backside surface 40 that reduces circulation of heat transfer fluid through the grooves. On backing plates that do not have intersecting grooves, the stagnant layer of fluid remains trapped in the grooves 50 without exposure to excessive amounts of turbulence. Moreover, the heat transfer fluid is typically circulated by a magnet assembly that rotates about a central axis in the housing, which increases the laminar flow of fluid through the concentric grooves 50, further contributing to entrapping hot fluid within the circular grooves. It is believed that the intersecting grooves and arcuate channels 50, 54 break up the grooves 50 into shorter segments and provide corners at the intersections, about which the fluid flow is turbulent. This turbulence stirs the stagnant layer at the bottom of the grooves 50 to force this fluid out of the groove and allow fresh, unheated fluid to enter the groove. The quicker moving circulating fluid is believed to considerably reduce the thickness and insulating effect of the slow moving stagnant layer, thereby increasing the heat transfer between the backing plate and the heat transfer fluid.

The concentric grooves 50 and arcuate channels 54 also provide an increase in total surface area of the backside surface 40. The grooved backside surface 50 can have a surface area that is from 50% to 120% greater than the surface area of a planar backside surface of a backing plate of similar dimensions. For example, if the surface area of the planar backside of a conventional backing plate is "A" cm$^2$, the area of the grooved backing plate 26 will be 1.5 A to 2.2 A.

Figure 3:
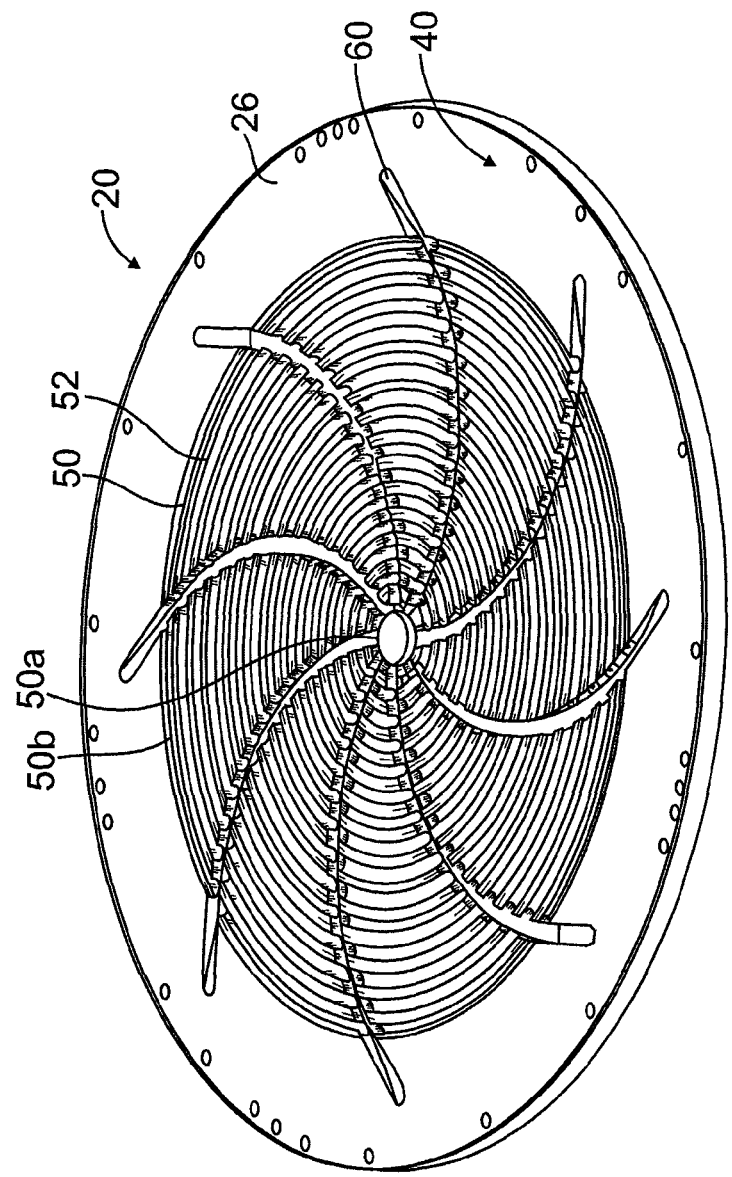
FIG. 3 is a perspective view of the backside surface of the backing plate showing a plurality of intersection circular grooves and arcuate channels.

In one embodiment, as shown in FIG. 3, the circular grooves 50 are spaced apart and concentric to one another. In one embodiment the number of grooves is 15. In other embodiments, the number of grooves range from about 2 grooves to about 20 grooves. Those skilled in the art will realize that the number of grooves can vary depending on the fluid used and the specific application. Each groove 50 comprises a Δr (distance between the outer radius of a particular groove 50 and its inner radius) ranging from about 2 mm to about 10 mm. In one example, Δr is about 6 mm. The ridges 52 between the grooves 50 have a width ranging from about from about 2 mm to about 10 mm. In one example, the width is about 6 mm. FIG. 3 shows a backside surface 40 having fifteen grooves 50 which are concentric and annular with fourteen intervening ridges 52.

The distribution of the grooves 50 and ridges 52 is selected to overlap with the rotational track of the rotating magnet assembly, such that the region over which the magnet rotates is almost entirely covered with grooves 50 and ridges 52. In one version, the circular grooves 50 are spread across an area of at least about 50% of the area of the backside surface 40, or even at least 75% of the backside surface 40, to maximize the effect of the grooves 50. The higher coverage area of the groves 50, as compared to the prior art, serve to cooperatively dissipate additional heat from the backside surface 40 causing the whole target 20 to operate at cooler temperatures during sputter processing.

In one version, the grooves 50 comprise an innermost radially inner grove 50a and an outermost radially outer groove 50b, with a plurality of grooves 50 are distributed between the inner and outer grooves 50a,b. The inner diameter of the inner groove 50a is selected in relation to the diameter of the shaft of the rotating magnet assembly and can even be the same diameter as the magnet assembly shaft. The inner groove 50a is situated directly under the shaft, and the radius of the outer groove 50b is selected in relation to the maximum radius of rotation of the magnet assembly about the rotation shaft. For example, the radius of the outer groove 50b can be selected to be substantially the same as the maximum radius of rotation of the magnet assembly about the rotation shaft. This grooved surface provides an increased cooling surface area in the region corresponding both to the circulated fluid and to the regions of the sputtering surface 34 that have magnetically enhanced sputtering and require further temperature control.

The arcuate channels 54 intersect the circular grooves 50 by cutting through the plurality of circular ridges 52 of the circular grooves 50. The arcuate channels 54 serve as drainage channels which prevent stagnation of heat transfer fluid within the grooves 50 to substantially improve heat transfer from the pattern of intersecting circular grooves and arcuate channels 50, 54, respectively. The arcuate channels 54 comprise arcs which are curved and extend primarily along the radial direction. The arcuate channels 54 are spaced apart from one another by a distance that varies across the radial direction, with a larger gap near the periphery of the backside surface 40 and a smaller distance closer to the center of the backside surface 40. In one version, as shown FIG. 3, the shape of each arcuate channel can be approximated by the polar equation:

$$r=\arcsin(\theta) \text{ for } 0<\theta<\pi/3.$$

In one version, the arcuate channels 54 are curved to be convex shaped relative to the direction of the rotating magnets in the chamber 22, as shown by the arrow 58 in FIG. 6. The shaped channels 54 prevent stagnation of heat transfer fluid within the grooves 50 by allowing heated fluid to escape from the grooves 50. The arcuate shape in this direction encourages laminar flow of the fluid through and from the circular grooves 50.

Figure 5:
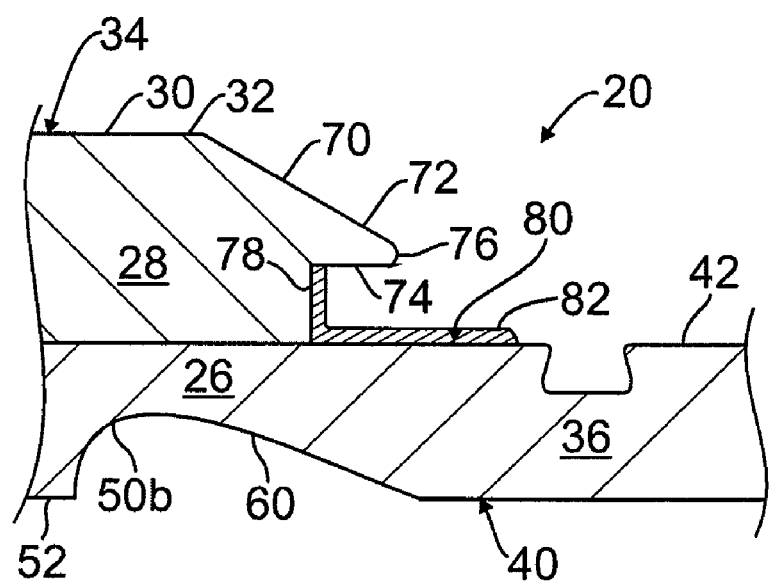
FIG. 5 is a sectional side view of a detail of the profile of the peripheral edge of the sputtering target.

The arcuate channels 54 also can have a curved tip region 60 that tapers upward to the backside surface 40 of the plate 26, as shown in FIGS. 3 and 5. The curved tip region 60 begins at about the radius of the outer circular groove 50b. The tapered tip is preferable over a stepwise tip because the tapered tip allows for a more laminar flow of fluid out of the ends of the channels 54.

The grooves 50 and channels 54 can be formed by machining the preformed backing plate 26, for example, cutting by a lathe or milling. The corners of the grooves 50 and resultant ridges 52 can also be rounded in the machining process, to reduce erosion and stress concentration at the corners.

In one embodiment, the sputtering plate 28 is mounted on the front surface 38 of the backing plate 26 by diffusion bonding by placing the two plates 28, 26 on each other and heating the plates to a suitable temperature, typically at least about 200° C.

In one version, the sputtering surface 34 of the sputtering plate is profiled to reduce flaking of process deposits as shown in FIGS. 2 and 5. In an exemplary embodiment, a peripheral inclined rim 70 surrounds the top plane 32 of the cylindrical mesa 30. The inclined rim 70 is inclined relative to the plane 32 of the cylindrical mesa 30 by an angle α of at least about 8°, for example, from about 10° to about 20° or even about 15°. An arcuate lip 72 is positioned around the inclined rim 70 and comprises a curved portion that extends outward and upward from the inclined rim 70. The curved portion terminates in an inward ledge 74 that is substantially parallel to the plane of the mesa 30 and which extends inward from a peripheral edge 76 of the lip 72. The inward ledge 74 connects to a cylindrical sidewall 78 that is recessed inward from the peripheral edge 76 of the arcuate lip 72. The recessed sidewall 78 is angled at an angle of about 90 degrees relative to the plane of the mesa 30 and comprises the sidewall 78 of the cylindrical mesa 30. The arcuate lip 72 and inward ledge 74 cooperate to shield the recessed sidewall 78 from process deposits. The inward ledge 74 also provides a surface to catch falling process deposits that flake off of the recessed sidewall 78 while the target 20 is installed in the chamber 22.

The recessed sidewall 78 is connected to the annular flange 36 of the backing plate 26. The annular flange 36 is substantially parallel to the plane of the cylindrical mesa 30 and comprises an outer footing 42 that rests on an isolator 44 in the chamber 22 and an inner flange surface 80 between the recessed sidewall 78 and the outer footing 42. Portions of the annular flange 76 and side surfaces of the target 20 can be coated with a protective coating 82 to provide better adhesion of sputtered material and to reduce flaking of the material from these surfaces.

Figure 4:
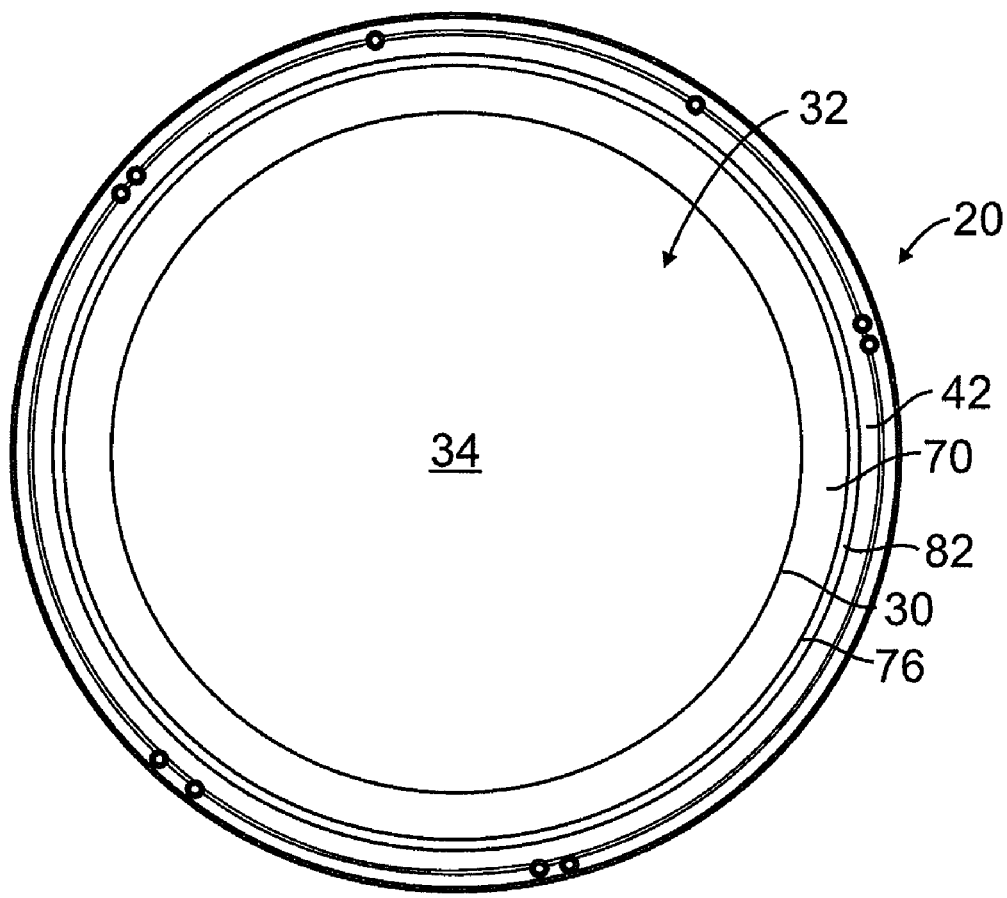
FIG. 4 is a top view of the front surface of the sputtering plate.

In one version the inner flange surface 80 and recessed sidewall 78 are coated with a protective coating 82, for example, a twin-wire arc sprayed aluminum coating as shown in FIGS. 4 and 5. Before coating, the inner flange surface 80 and recessed sidewall 78 are degreased and ground with a silicon carbide disc to achieve a roughness of 200 to 300 microinches. The coating 82 extends to cover the recessed sidewall 78 of the sputtering plate 28 and the inner flange surface 80 of the backing plate 26. The coating 82 has a final surface roughness of from about 500 to about 900 microinches, and a thickness of from about 5 to about 10 mils. The coating 82 protects the edges of the target 20 and provides better adhesion of the sputtered material to these surfaces.

An exemplary version of a sputtering process chamber 22 capable of processing a substrate 24 using the sputtering target 20 is shown in FIG. 6. The chamber 22 comprises enclosure walls 84 that enclose a plasma zone 86 and include sidewalls 88, a bottom wall 90, and a ceiling 92. The chamber 22 can be a part of a multi-chamber platform (not shown) having a cluster of interconnected chambers connected by a robot arm mechanism that transfers substrates 24 between the chamber. In the version shown, the process chamber 22 comprises a sputtering chamber, also called a physical vapor deposition or PVD chamber, which is capable of sputter depositing titanium on a substrate 24. However, the chamber 22 can also be used for other purposes, such as for example, to deposit aluminum, copper, tantalum, tantalum nitride, titanium nitride, tungsten or tungsten nitride; thus, the present claims should not be limited to the exemplary embodiments described herein to illustrate the invention.

In one version the chamber 22 is equipped with a process kit to adapt the chamber 22 for different processes. The process kit comprises various components that can be removed from the chamber 22, for example, to clean sputtering deposits off the component surfaces, replace or repair eroded components. In one version, the process kit comprises a ring assembly 94 for placement about a peripheral wall of the substrate support 100 that terminates before an overhanging edge of the substrate 24, as shown in FIG. 6. The ring assembly 94 comprises a deposition ring 96 and a cover ring 98 that cooperate with one another to reduce formation of sputter deposits on the peripheral walls of the support 100 or the overhanging edge of the substrate 24.

The process kit can also includes a shield assembly 104 that encircles the sputtering surface 34 of a sputtering target 20 and the peripheral edge of the substrate support 100, as shown in FIG. 6, to reduce deposition of sputtering deposits on the sidewalls 88 of the chamber 22 and the lower portions of the support 100. As shown in FIG. 6, shield assembly 104 comprises an upper shield 106 and a lower shield 108. Portions of the shield assembly 104, such as for example the upper shield 106, can be biased during substrate processing in order to affect the chamber environment. The shield assembly 104 reduces deposition of sputtering material on the surfaces of the substrate support 100, sidewalls 88 and bottom wall 90 of the chamber 22, by shadowing these surfaces.

The process chamber 22 comprises a substrate support 100 to support the substrate 24 which comprises a pedestal 110. The pedestal 110 has a substrate receiving surface 102 that receives and supports the substrate 24 during processing, the surface 102 having a plane substantially parallel to a sputtering surface 34 of an overhead sputtering target 20. The support 100 can also include an electrostatic chuck 112 to electrostatically hold the substrate 24 and/or a heater (not shown), such as an electrical resistance heater or heat exchanger. In operation, a substrate 24 is introduced into the chamber 22 through a substrate loading inlet (not shown) in the sidewall 88 of the chamber 22 and placed on the substrate support 100. The support 100 can be lifted or lowered to lift and lower the substrate 24 onto the support 100 during placement of a substrate 24 on the support 100. The pedestal 110 can be maintained at an electrically floating potential or grounded during plasma operation.

During a sputtering process, the target 20, support 100, and upper shield 106 are electrically biased relative to one another by a power supply 114. The target 20, upper shield 106, support 100, and other chamber components connected to the target power supply 114 operate as a gas energizer to form or sustain a plasma of the sputtering gas. The gas energizer can also include a source coil (not shown) that is powered by the application of a current through the coil. The plasma formed in the plasma zone 106 energetically impinges upon and bombards the sputtering surface 34 of the target 20 to sputter material off the surface 34 onto the substrate 24.

The sputtering gas is introduced into the chamber 22 through a gas delivery system 118 that provides gas from a process gas source 120 via conduits 122 having gas flow control valves 124, such as a mass flow controllers, to pass a set flow rate of the gas therethrough. The gases are fed to a mixing manifold (also not shown) in which the gases are mixed to form a desired process gas composition and fed to a gas distributor 126 having gas outlets in the chamber 22. The process gas source 120 may comprise a non-reactive gas, such as argon or xenon, which is capable of energetically impinging upon and sputtering material from a target. The process gas source 120 may also include a reactive gas, such as one or more of an oxygen-containing gas and a nitrogen-containing gas, that are capable of reacting with the sputtered material to form a layer on the substrate 24. Spent process gas and byproducts are exhausted from the chamber 22 through an exhaust 128 which includes exhaust ports 130 that receive spent process gas and pass the spent gas to an exhaust conduit 132 having a throttle valve 134 to control the pressure of the gas in the chamber 22. The exhaust conduit 132 is connected to one or more exhaust pumps 136. Typically, the pressure of the sputtering gas in the chamber 22 is set to sub-atmospheric levels, such as a vacuum environment, for example, gas pressures of 1 mTorr to 400 mTorr.

The chamber 22 can also include a heat exchanger comprising a housing 140 capable of holding a heat transfer fluid which is mounted abutting the backside surface 40 of the target 20. The housing 140 comprises walls which are sealed about the backside surface 40 of the target 20. The housing 140 can be made from an insulating medium, such as fiberglass. A heat transfer fluid, such as chilled deionized water, is introduced into the housing 140 though an inlet and is removed from the housing 140 through an outlet (not shown). The heat exchanger serves to maintain the target 20 at lower temperatures to further reduce the possibility of forming erosion grooves and microcracks in the target 20.

The chamber can also include a magnetic field generator 46 comprising a plurality of rotatable magnets. In one version, as shown in FIG. 6, the magnetic field generator comprises two sets of rotatable magnets 152, 154 that are mounted on a common plate 156 and capable of rotating about a central axis in back of the target 20.

The first set of rotating magnets 152 comprises one or more central magnets 160 having a first magnetic flux or magnetic field orientation, and one or more peripheral magnets 162 having a second magnetic flux or magnetic field orientation. In one version, the ratio of the first magnetic flux to the second magnetic flux is at least about 1:2, for example, from about 1:3 to about 1:8, or even about 1:5. This allows the magnetic field from the peripheral magnets 162 to extend deeper into the chamber 22 towards the substrate 24. In one example, the first set of rotating magnets 152 comprises a set of central magnets 160 having a first magnetic field orientation, surrounded by a set of peripheral magnets 162 having a second magnetic field orientation. For example, the second magnetic field orientation can be generated by positioning the peripheral magnets 162 so that their polarity direction is opposite to the polarity direction of the central magnets 160.

The version of FIG. 6 shows a second, larger set of rotatable magnets 154. The second set of rotatable magnets 154 comprises a central magnet 166 having a first magnetic flux or magnetic field orientation, and a peripheral magnet 168 with a second magnetic flux or magnetic field orientation. In one version, the ratio of the first magnetic flux to the second magnetic flux is about 1:1.

The magnetic field generator 46 comprises a motor 170 and axle 172 to rotate a plate 156 on which the sets of rotatable magnets 152, 154 are mounted. The rotation system rotates the sets of rotatable magnets 152, 154 at from about 60 to about 120 rpm, for example, about 80 to about 100 rpm. In one version, the sets of rotatable magnets 152, 154 comprise NdFeB. The first set of rotatable magnets 152 is used to scan the edge of the target 20 to produce a highly ionized sputter flux. The second set of rotatable magnets 154 can be used to produce a flux of ion bombardment about the central and peripheral regions of the target 20. The larger, or second set of rotatable magnets 154 can be switched on to clean sputter material redeposited on the target center and about the periphery. In addition to providing a rotating and changing magnetic field about the sputtering surface 34, the magnetic field generator 46 and sets of rotatable magnets 152, 154 push and stir the heat transfer fluid, thereby circulating a heat transfer fluid in the housing 140.

To counteract the large amount of power delivered to the target 20, the back of the target 20 may be sealed to a backside coolant chamber. The backside coolant chamber can be separate from the housing 140, or the coolant chamber and housing 140 can be a single integrated chamber as shown in FIG. 6. Heat transfer fluid comprising chilled deionized water 180 or other cooling liquid is circulated through the interior of the coolant chamber to cool the target 20. The magnetic field generator 46 is typically immersed in the cooling water 180, and the axle 172 passes through the backside chamber through a rotary seal 174.

The chamber 22 is controlled by a controller 182 that comprises program code having instruction sets to operate components of the chamber 22 to process substrates 24 in the chamber 22. For example, the controller 182 can comprise program code that includes a substrate positioning instruction set to operate the substrate support 100 and substrate transport; a gas flow control instruction set to operate gas flow control valves 124 to set a flow of sputtering gas to the chamber 22; a gas pressure control instruction set to operate the throttle valve 134 to maintain a pressure in the chamber 22; a gas energizer control instruction set to operate the gas energizer to set a gas energizing power level; a temperature control instruction set to control a temperature control system (not shown) in the pedestal 110 or wall 88 to set temperatures of the substrate 24 or walls 88, respectively; and a process monitoring instruction set to monitor the process in the chamber 22.

The sputtering process can be used to deposit a layer comprising titanium or a titanium compound on a substrate. The titanium layers can be used by themselves, or in combination with other layers. For example, a sputtered titanium layer can be used as a barrier layer, e.g., Ti/TiN stacked layers are often used as liner barrier layers and to provide contacts to the source and drain of a transistor. In another example, a titanium layer is deposited on a silicon wafer and portions of the titanium layer in contact with the silicon are converted to titanium silicide layers by annealing. In another configuration, the diffusion barrier layer below a metal conductor, includes a titanium oxide layer formed by sputter depositing titanium on the substrate 24 and then transferring the substrate to an oxidizing chamber to oxidize the titanium by heating it in an oxygen environment to form titanium oxide. Titanium oxide can also be deposited by introducing oxygen gas into the chamber while titanium is being sputtered. Titanium nitride can be deposited by reactive sputtering methods by introducing a nitrogen containing gas into the chamber while sputtering titanium.

The present invention has been described with reference to certain preferred versions thereof; however, other versions are possible. For example, the sputtering plate 28 and backing plate 26 of the target 20 can be made from other materials than those described herein, and can also have other shapes and sizes. Therefore, the spirit and scope of the appended claims should not be limited to the description of the preferred versions contained herein.

What is claimed is:

1. A sputtering target for a sputtering chamber, the sputtering target comprising:
   (a) a backing plate with a backside surface having radially inner, middle and outer regions, the backside surface comprising:
      (i) a plurality of circular grooves which are spaced apart from one another; and
      (ii) at least one arcuate channel cutting through the circular grooves and extending from the radially inner region to the radially outer region of the backing plate; and
   (b) a sputtering plate mounted on the front surface of the backing plate.

2. A target according to claim 1 wherein the circular grooves are concentric grooves.

3. A target according to claim 2 wherein the circular grooves comprise from about 2 to about 20 grooves.

4. A target according to claim 1 wherein all the circular grooves are located at the radially middle region of the backside surface.

5. A target according to claim 1 wherein the backside surface comprises at least about 8 arcuate channels.

6. A target according to claim 5 wherein the arcuate channels are spaced apart from one another by an angle of from about 30 to about 90 degrees as measured from the center of the backside surface.

7. A target according to claim 1 wherein the backing plate comprises a thermal conductivity of at least about 200 W/mK and an electrical resistivity of from about 2 to about 5 μohm cm.

8. A target according to claim 1 wherein the backing plate comprises an alloy of copper and chrome.

9. A target according to claim 1 wherein the sputtering plate comprises a (i) cylindrical mesa having a top plane, (ii) a peripheral inclined rim surrounding the top plane of the cylindrical mesa, the peripheral inclined rim being inclined relative to the plane of the cylindrical mesa by an angle of at least about 8°, (iii) an arcuate lip around the peripheral inclined rim, and (iv) a recessed sidewall below the arcuate lip.

10. A target according to claim 9 wherein the backing plate comprises an annular flange that extends radially outward from the sputtering plate, the annular flange comprising inner flange surface, and wherein at least a portion of the recessed sidewall of the sputtering plate and the inner flange surface of the annular flange comprise a coating having a surface roughness of from about 500 to about 900 microinches.

11. A target according to claim 1 further comprising a heat exchanger housing capable of holding a heat transfer fluid about the backside surface of the backing plate, and a plurality of rotatable magnets within the housing.

12. A target according to claim 1 wherein the sputtering plate is composed of titanium or titanium nitride.

13. A sputtering chamber comprising the sputtering target of claim 12 mounted therein, and the chamber further comprising:
   (1) a substrate support facing the sputtering target;
   (2) a gas distributor to introduce a gas into the sputtering chamber;
   (3) a gas energizer to energize the gas to form a plasma to sputter the sputtering target; and
   (4) a gas exhaust port to exhaust gas from the sputtering chamber.

14. A magnetron sputtering target assembly for a sputtering chamber, the sputtering target assembly comprising:
   (a) a heat exchanger housing capable of holding heat transfer fluid about a plurality of rotatable magnets;
   (b) a sputtering target abutting the housing such that the heat transfer fluid contacts a backside surface of the sputtering target, the sputtering target comprising:
      (i) a backing plate having the backside surface, the backside surface including radially inner, middle and outer regions,
      (ii) a plurality of circular grooves which are spaced apart from, and concentric to, one another, and
      (iii) at least one arcuate channel cutting through the circular grooves and extending from the radially inner region to the radially outer region of the backside surface; and
   (c) a sputtering plate mounted on the front surface of the backing plate.

15. An assembly according to claim 14 wherein the circular grooves comprise from about 5 to about 20 grooves, and are located at the radially middle region of the backside surface.

16. An assembly according to claim 14 wherein the at least one arcuate channel comprises at least about 8 channels which are spaced apart from one another by an angle of from about 30 to about 90 degrees as measured from the center of the backside surface.

17. An assembly according to claim 14 wherein the backing plate comprises an alloy of copper and chrome, and the sputtering plate is composed of titanium or titanium nitride.

18. A sputtering chamber comprising the magnetron sputtering target assembly of claim 14 mounted therein, the sputtering chamber further comprising:
   (1) a substrate support facing the sputtering target;
   (2) a gas distributor to introduce a gas into the sputtering chamber;
   (3) a gas energizer to energize the gas to form a plasma to sputter the sputtering target; and
   (4) a gas exhaust port to exhaust gas from the sputtering chamber.

19. A magnetron sputtering target assembly for a sputtering chamber, the sputtering target assembly comprising:
   (a) a heat exchanger housing capable of holding heat transfer fluid about a plurality of rotatable magnets;
   (b) a sputtering target abutting the housing such that the heat transfer fluid contacts a backside surface of the sputtering target, the sputtering target comprising:
      (i) a backing plate having the backside surface, the backside surface including radially inner, middle and outer regions,
      (ii) a plurality of concentric circular grooves located at radially middle region of the backside surface, and
      (iii) a plurality of arcuate channels extending from the radially inner region to the radially outer region of the backside surface; and
      (c) a sputtering plate mounted on the front surface of the backing plate.

20. An assembly according to claim 19 wherein the circular grooves comprise from about 2 to about 20 grooves and wherein the backside surface comprises at least about 8 arcuate channels.

21. An assembly according to claim 19 wherein the backing plate comprises an alloy of copper and chrome and the sputtering plate is composed of titanium or titanium nitride.

22. A sputtering chamber comprising the magnetron sputtering target assembly of claim 19 mounted therein, the sputtering chamber further comprising:
   (1) a substrate support facing the sputtering target;
   (2) a gas distributor to introduce a gas into the sputtering chamber;
   (3) a gas energizer to energize the gas to form a plasma to sputter the sputtering target; and
   (4) a gas exhaust port to exhaust gas from the sputtering chamber.

23. An assembly according to claim 19 wherein the sputtering plate comprises a (i) cylindrical mesa having a top plane, (ii) a peripheral inclined rim surrounding the top plane of the cylindrical mesa, the peripheral inclined rim being inclined relative to the plane of the cylindrical mesa by an angle of at least about 8°, (iii) an arcuate lip around the peripheral inclined rim, and (iv) a recessed sidewall below the arcuate lip.

24. An assembly according to claim 19 wherein the backing plate comprises an annular flange that extends radially outward from the sputtering plate, the annular flange comprising inner flange surface, and wherein at least a portion of the recessed sidewall of the sputtering plate and the inner flange surface of the annular flange comprise a coating having a surface roughness of from about 500 to about 900 microinches.

* * * * *